United States Patent
Kobaru

(10) Patent No.: US 7,838,840 B2
(45) Date of Patent: Nov. 23, 2010

(54) CHARGED PARTICLE BEAM APPARATUS

(75) Inventor: Atsushi Kobaru, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 330 days.

(21) Appl. No.: 12/163,121

(22) Filed: Jun. 27, 2008

(65) Prior Publication Data

US 2009/0001279 A1 Jan. 1, 2009

(30) Foreign Application Priority Data

Jun. 29, 2007 (JP) ................ 2007-171413

(51) Int. Cl.
*H01J 3/14* (2006.01)
*H01J 37/26* (2006.01)
(52) U.S. Cl. .............. 250/396 R; 250/310; 250/311
(58) Field of Classification Search ........... 250/306, 250/307, 310, 311, 396 R, 397, 399
See application file for complete search history.

(56) References Cited

U.S. PATENT DOCUMENTS

| | | | | |
|---|---|---|---|---|
| 6,538,249 B1 * | 3/2003 | Takane et al. ........... | 850/9 |
| 7,705,300 B2 * | 4/2010 | Morokuma et al. ........ | 250/310 |
| 2004/0211899 A1 * | 10/2004 | Ezumi et al. ............ | 250/310 |
| 2005/0092921 A1 * | 5/2005 | Nakasuji et al. ......... | 250/306 |
| 2005/0236570 A1 * | 10/2005 | Morokuma et al. ........ | 250/311 |
| 2007/0200947 A1 * | 8/2007 | Kobaru et al. ........... | 348/345 |
| 2008/0099697 A1 * | 5/2008 | Watanabe et al. ........ | 250/492.22 |

FOREIGN PATENT DOCUMENTS

JP 05-003013 1/1993

* cited by examiner

*Primary Examiner*—Bernard E Souw
(74) *Attorney, Agent, or Firm*—McDermott Will & Emery LLP

(57) ABSTRACT

A charged particle beam apparatus for measuring and inspecting a sample having some parts in focus and other parts out of focus in an image due to the effect of the roughness of the sample surface is disclosed, in which in order to acquire a clear image of the whole or a predetermined area in the image, the focus adjustment conditions for each point in the area to be scanned by the charged particle beam are determined in advance, and the focus adjustment conditions thus determined are applied selectively to the patterns formed under the same fabrication conditions as the sample for which the focus adjustment conditions are determined.

9 Claims, 16 Drawing Sheets

DEFLECTION PATTERN (a) FOCUS DISTRIBUTION MATRIX (b) SECTIONAL VIEW OF ACTUAL PATTERN (a) FOCUS
Fa=200
Fb=100
Fc=500

(b) FOCUS ASSESSMENT VALUE OF CELL A (c) FOCUS ASSESSMENT VALUE OF CELL B (d) FOCUS ASSESSMENT VALUE OF CELL C

× ACTUALLY MEASURED FOCUS VALUE
○ CORRECTED FOCUS VALUE

STEPS OF AUTOMATICALLY FOCUSING A

| 200 | 200 | 200 | 200 | 200 | 200 | 200 | 200 | 200 | 200 |
|---|---|---|---|---|---|---|---|---|---|
| 200 | 200 | 200 | 200 | 200 | 200 | 200 | 200 | 200 | 200 |
| 200 | 200 | 200 | 200 | 100 | 100 | 200 | 200 | 200 | 200 |
| 200 | 200 | 200 | 100 | 50 | 50 | 100 | 200 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 100 | 50 | 50 | 50 | 50 | 100 | 200 | 200 |
| 200 | 200 | 200 | 100 | 50 | 50 | 100 | 200 | 200 | 200 |
| 200 | 200 | 200 | 200 | 100 | 100 | 200 | 200 | 200 | 200 |
| 200 | 200 | 200 | 200 | 200 | 200 | 200 | 200 | 200 | 200 |
| 200 | 200 | 200 | 200 | 200 | 200 | 200 | 200 | 200 | 200 |

(a) FOCUS DISTRIBUTION (b) SECTIONAL VIEW OF ACTUAL PATTERN

FIG. 12
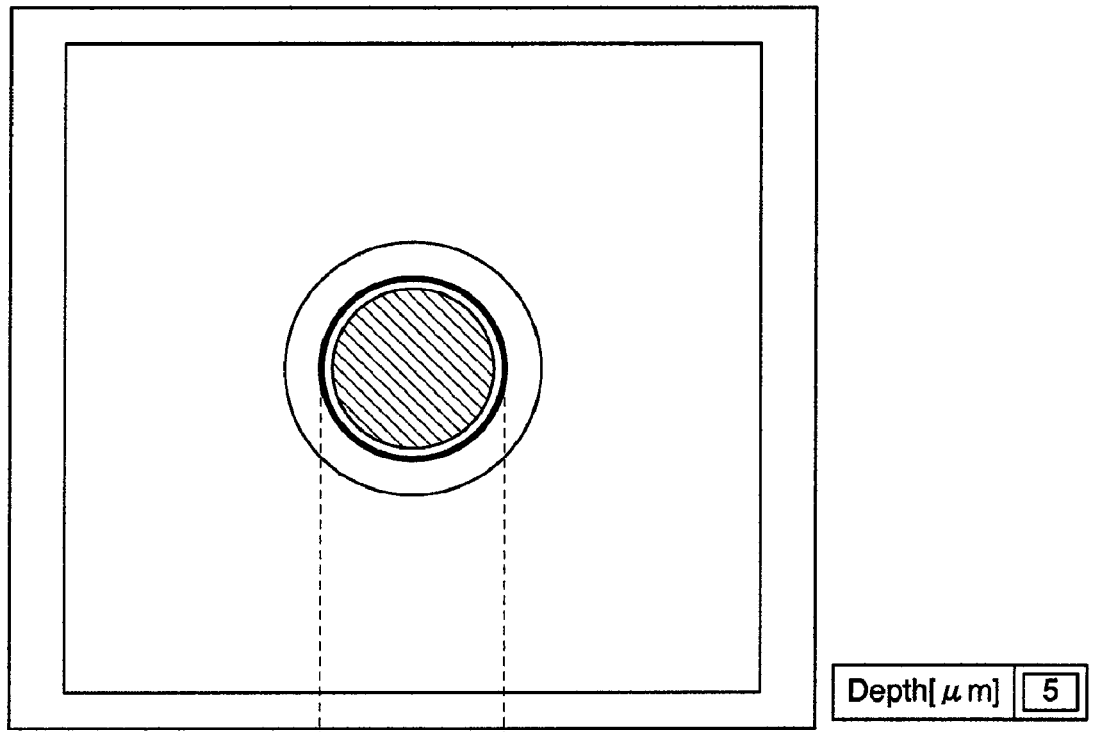
(a) SEM IMAGE
Depth[μm]  5
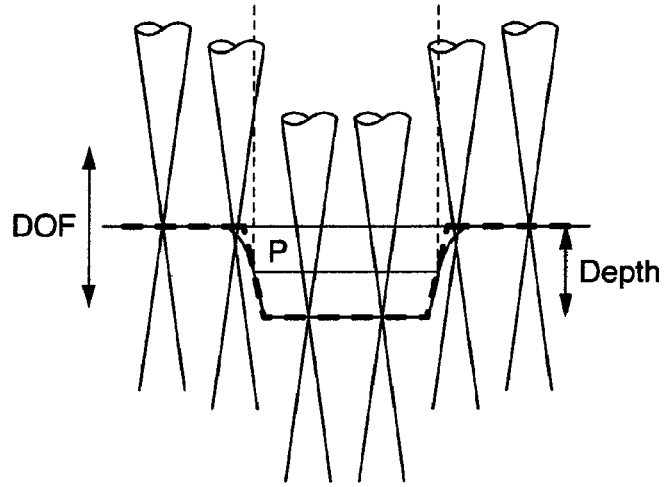
(b) VIRTUAL SECTIONAL VIEW (a) FOCUS DISTRIBUTION (b) VIRTUAL SECTIONAL VIEW (a) CIRCUIT DESIGN DATA (b) VIRTUAL PATTERN FIGURE (a) FOCUS DISTRIBUTION CURVE RELAXING PROCESS (b) ACTUAL PRIMARY ELECTRON SCANNING

IN FOCUS FOR BOTH LINE AND SPACE

FOV SHIFTED ONE LINE FROM DESIRED POSITION.
OUT OF FOCUS FOR BOTH LINE AND SPACE

CHARGED PARTICLE BEAM APPARATUS

BACKGROUND OF THE INVENTION

This invention relates to a charged particle beam apparatus, or in particular, a scanning electron microscope for observing or measuring the shape, material, etc. of a sample utilizing a physical phenomenon such as the generation of secondary electrons obtained from a sample to which the charged particle beam is applied.

Secondary electrons can be generated by applying the electron beam to a sample in vacuum. The scanning electron microscope is used to observe the shape of a sample taking advantage of the phenomenon in which the secondary electrons thus generated undergo a change depending on the shape of the sample. Normally, the electron beam radiated is reduced by an electron lens having a focal point on the surface of the sample. By doing so, the roughness of the sample can be grasped as a clear image. The clarity of the image is determined by the degree to which the electron beam is reduced. Specifically, the image resolution can be improved and the image clarity increased by reducing the electron beam strongly. An excessive reduction, however, would exceed the performance of the electron lens and the resulting increase in the aberration such as the diffraction aberration would deteriorate the image clarity. In designing an electron microscope of a high resolution, therefore, the design of an optical system as a whole including a plurality of lenses is finally determined while reducing the electron beam by the electron lens called an objective lens placed in opposed relation to the sample to the degree just before the diffraction aberration begins to exceed the image resolution of the objective lens.

The reduction in the electron beam by the objective lens, though capable of improving the image resolution, shortens the depth of the clearly visible surface roughness, called the focal depth, of the sample in inverse proportion.

The semiconductor devices recently fabricated in the semiconductor fabrication process are inspected using this electron microscope, and with the ever increasing micronization of the fabrication process, an electron microscope of a higher resolution is in demand. As described above, however, an improved image resolution shortens the focal depth, and only those samples having a shallow roughness can be observed. In the semiconductor fabrication process, on the other hand, the increased micronization is accompanied by the tendency to increase the depth of the holes often called the contact holes formed in the sample surface. In order to meet these contradicting requirements, U.S. Pat. No. 6,538,249B1 (Patent Document 1), for example, discloses a technique in which a plurality of SEM (scanning electron microscope) images are retrieved while changing only the focal point at the same position on a sample, and only the images in focus obtained by the subsequent image processing are combined, thereby finally forming the whole SEM image in focus regardless of the depth of the sample roughness.

JP-A-5-3013 (Patent Document 2), on the other hand, describes a process of inspection by focusing the image of a rough sample in accordance with the roughness under the scanning electron microscope.

SUMMARY OF THE INVENTION

In the technique disclosed in Patent Document 1, however, the electron beam radiation is repeated the number of times equal to the number of the retrieved images by changing the focal point at the same position on the sample, and therefore, the sample is damaged considerably by the electron beam radiation. Not only that, the increased amount of electron beam radiation in proportion to the number of images picked up increases the charge amount on the sample surface, thereby tending to cause the FOV (field of view) drift due to the charging during the retrieval of the series of images. Also, a plurality of SEM images are required to obtain each image, and therefore, a longer time is taken to retrieve the required image. The FOV drift, if occurred, is liable to have an adverse effect.

For these reasons, the technique disclosed in Patent Document 1 poses the problem that an application to the measurement and inspection of the semiconductor devices is difficult from the viewpoint of the throughput or the possible damage to the sample. In other words, the large damage to the sample and the large effect of the FOV drift makes difficult the constantly accurate measurement, i.e. the measurement high in measurement reproducibility.

Patent Document 2, on the other hand, in spite of the description therein of an example in which the image is focused in accordance with the degree of the roughness of the sample surface, fails to refer to the application to the measurement or observation of the semiconductor devices, and therefore, is difficult to use for the measurement or observation of the semiconductor devices. Especially, the quality of a completed semiconductor device is varied with the difference of the fabrication conditions, and therefore, the information on the roughness of the sample surface, if acquired in advance, may not always be used properly for adjusting the focal point. Also, the problem of the throughput and the damage to the sample is posed, as described above, by the execution of the process to collect the focus adjust data each time of measurement or inspection.

An explanation is given below about a charged particle beam apparatus suitably used to acquire a clear image of the whole or a predetermined area for measuring or inspecting a sample having some parts in focus and other parts out of focus in the same image due to the roughness of the sample surface.

According to this invention, there is provided an apparatus for scanning a charged particle beam on a sample formed in the semiconductor fabrication process, wherein the focus adjust conditions are determined in advance for each point in the scanning area, and the charged particle beam is scanned while the focus adjust conditions thus determined are selectively applied to each pattern formed under the same fabrication conditions as those of the sample for which the focus adjust conditions are determined. Also, other charged particle beam apparatuses suitable for acquiring a clear image as a whole or within a predetermined area are proposed.

With the configuration described above, an image can be formed based on the proper focus adjust conditions for each point within the particular image according to each semiconductor fabrication condition, and therefore, an image not reduced in throughput and free of damage to the sample can be formed regardless of the sample type. Incidentally, the specific technical effects of the other charged particle beam apparatuses described above are explained in detail later with reference to embodiments of the invention.

Other objects, features and advantages of the invention will become apparent from the following description of the embodiments of the invention taken in conjunction with the accompanying drawings.

BRIEF DESCRIPTION OF THE DRAWINGS

FIG. 12 is a diagram for explaining the method of determining the focus adjust conditions based on the input value of the pattern shape and depth.

DETAILED DESCRIPTION OF THE INVENTION

Figure 1:
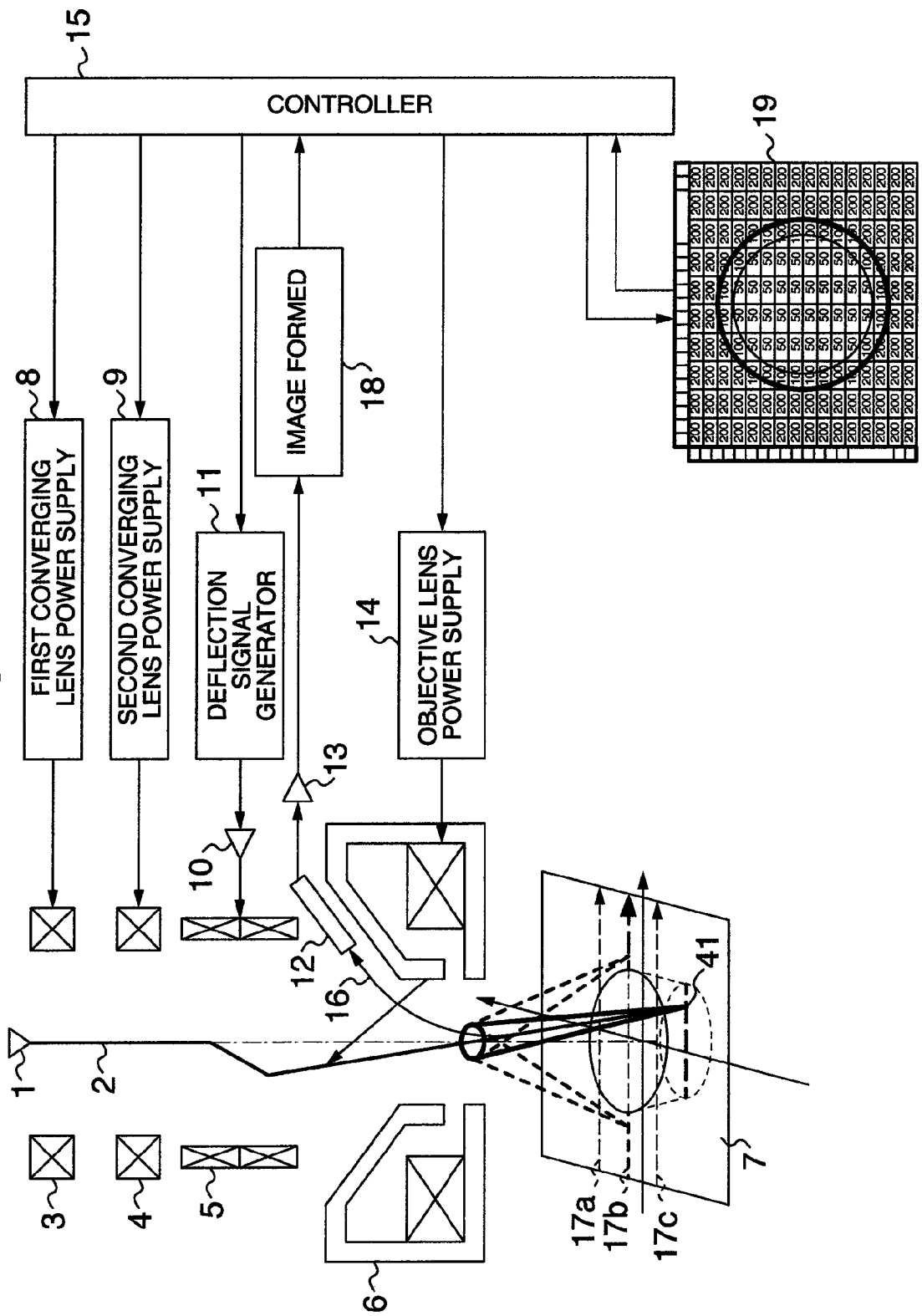
FIG. 1 is a schematic diagram for explaining the scanning electron microscope for adjusting the focus by adjusting the excitation current of the objective lens.

An embodiment described below includes a means for changing the focal point in accordance with the degree of roughness of the sample surface while scanning an electron beam to obtain a clear image as a whole regardless of the depth of the particular roughness of the sample surface. In the process, four main methods are prepared to obtain the depth information of the sample surface roughness in advance.

In a first method, the function described above can be realized by assuming an application to the semiconductor fabrication process and supplying the sample surface information to and storing the information in a device before starting the scanning process. Specifically, the scanning electron microscope is often used for automatic length measurement in the semiconductor fabrication process by preparing a file called the recipe with the inspection contents programmed before starting the inspection. At the time of preparing the recipe, the operator introduces a test sample or a wafer in the case under consideration to the device (scanning electron microscope) thereby to register the inspection point and the sample image.

Once the recipe is prepared, any number of incoming wafers having the same pattern layout as the test sample can be automatically inspected. The recipe is prepared for each pattern formed under the same fabrication conditions. The "fabrication conditions" are defined to include the sample type (pattern layout, pattern size, etc.), the fabrication conditions of the semiconductor production equipment, the production line, the type of the fabrication factory and the fabrication time or any combination of them. The focus adjust condition, which is determined in advance for each of the fabrication conditions classified to include the aforementioned factors, is used at the time of measurement or inspection of the patterns having the same fabrication condition.

In preparing the recipe, the information on the sample surface flatness around the intended pattern is obtained based on the registered image. The operator, before registering the image, always performs the focusing operation at the intended pattern position of the test sample.

At the time of preparing the recipe, this focusing operation is performed while changing the focal point stepwise automatically, so that the focus assessment value is calculated for each pixel of all the plural images obtained. In this way, the operator is informed, for each flat pixel of the intended pattern, at which focal point the image clarity is at its peak and thus obtains the depth of the surface roughness. At the time of obtaining an image to be registered as the recipe, the image is set to the focal point at which the proper clarity can be obtained for the whole image.

According to the second method, which is assumed to be used in the same semiconductor fabrication method as in the first method, the sample image is registered by the operator in such a manner that the shape of the pattern is overwritten manually on the SEM image, and the relative depth information is manually input for each area of the shape. In this way, the effects equivalent to those of the first method can be obtained.

In the third method which is assumed to be used also in the semiconductor fabrication process, the circuit design information of the semiconductor pattern on the wafer is input and stored in the device beforehand. Based on this information, the depth information of the roughness on the sample surface is obtained. In this way, the effects equivalent to those of the foregoing two methods can be obtained. In recent years, the technique of preparing the recipe automatically from the circuit design information has rapidly developed and now provides a promising method.

According to the fourth method, which is executed basically the same way as the first method for the general sample observation in other than the semiconductor fabrication, the test sample is not used, but the focal point having the peak clarity is determined for all the pixels at the sample position where the SEM image is actually desired. Normally, in this general-purpose application, the image quality adjustment such as the focusing operation is executed taking time at the actual sample position, after which the image is actually acquired manually. As a part of this preparatory operation, the automatic focusing operation with the focal point changed stepwise is performed at least once, and by thus determining the surface roughness depth of all the pixels, the effects similar to those of the foregoing three methods can be obtained.

First Embodiment

An embodiment of the invention is shown in FIG. 1. The scanning electron microscope described below comprises an electron beam source 1, a first converging lens 3 and a second converging lens 4 for converging a primary electron beam 2 emitted from the electron beam source 1, a deflector 5 for deflecting the primary electron beam 2 to scan a sample 7, an objective lens 6 to focus the primary electron beam 2 on the sample 7, a secondary electron detector 12 for detecting the secondary electrons 16 generated after the primary electron beam 2 bombards the sample 7, a first converging lens power supply 8 and a second converging lens power supply 9 for driving the first converging lens 3 and the second converging lens 4, respectively, a deflection signal generator 11 for generating the defection signal in such a manner as to scan the first primary electron beam 2 on the sample 7 by a predetermined method, a deflector driver 10 for driving the deflector 5 in response to the deflection signal, an amplifier 13 for amplifying the secondary electron signal detected by the secondary electron detector 12, an image forming unit 18 for generating an image from the secondary electron signal amplified, an objective lens power supply 14 for driving the objective lens 6 in such a manner as to focus the primary electron beam 2 at a predetermined position, and a controller 15 for controlling these operations. Although the description that follows concerns the scanning electron microscope, the invention is not limited to it, but also applicable to other charged particle beam apparatuses such as an ion beam apparatus for reducing and scanning an ion beam.

The primary electron beam 2 scans a scan line 17b on the sample 7. With the arrival of the primary electron beam 2 at a hole pattern formed on the sample 7, the controller 15, by referring to a focus distribution memory 19 storing the depth of the sample surface roughness as a value for each pixel, controls the objective lens 6 through the objective lens power supply 14 along the hole side wall falling toward the bottom of the sample from the surface thereof, thereby proceeding to scan while changing the focal point 41 of the primary electron beam 2 in the direction along the height.

Figure 2:
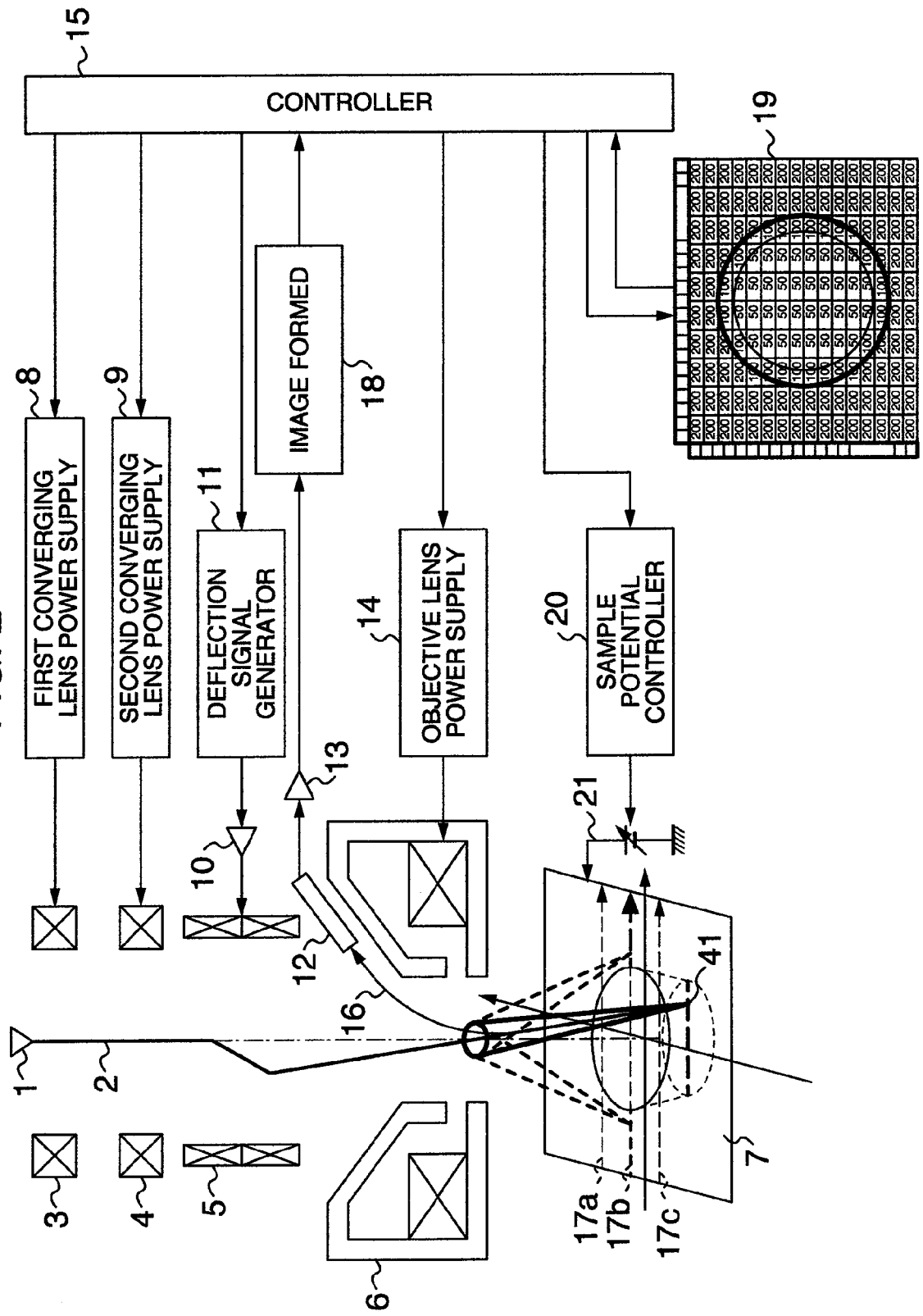
FIG. 2 is a schematic diagram for explaining the scanning electron microscope for adjusting the focus by adjusting the potential of the sample.

Unlike FIG. 1 in which the focal point is changed by controlling the objective lens, FIG. 2 shows a case in which the focal point is changed by changing the sample potential. The objective lens, which generates a magnetic field with the current flowing in the coil built therein, is low in response and somewhat insufficient in the ability to follow the motion of the primary electron beam 2 running on the sample. A mechanism, if any, capable of intentionally applying an arbitrary voltage with respect to the ground to the sample 7 can control the focal point with a highly responsive applied voltage. Specifically, the controller 15, instead of controlling the objective lens 6, scans the primary electron beam 2 while changing the focal point 41 of the primary electron beam 2 along the height of the surface roughness of the sample 7 by controlling the sample potential source 21 through the sample potential controller 20.

Figure 3:
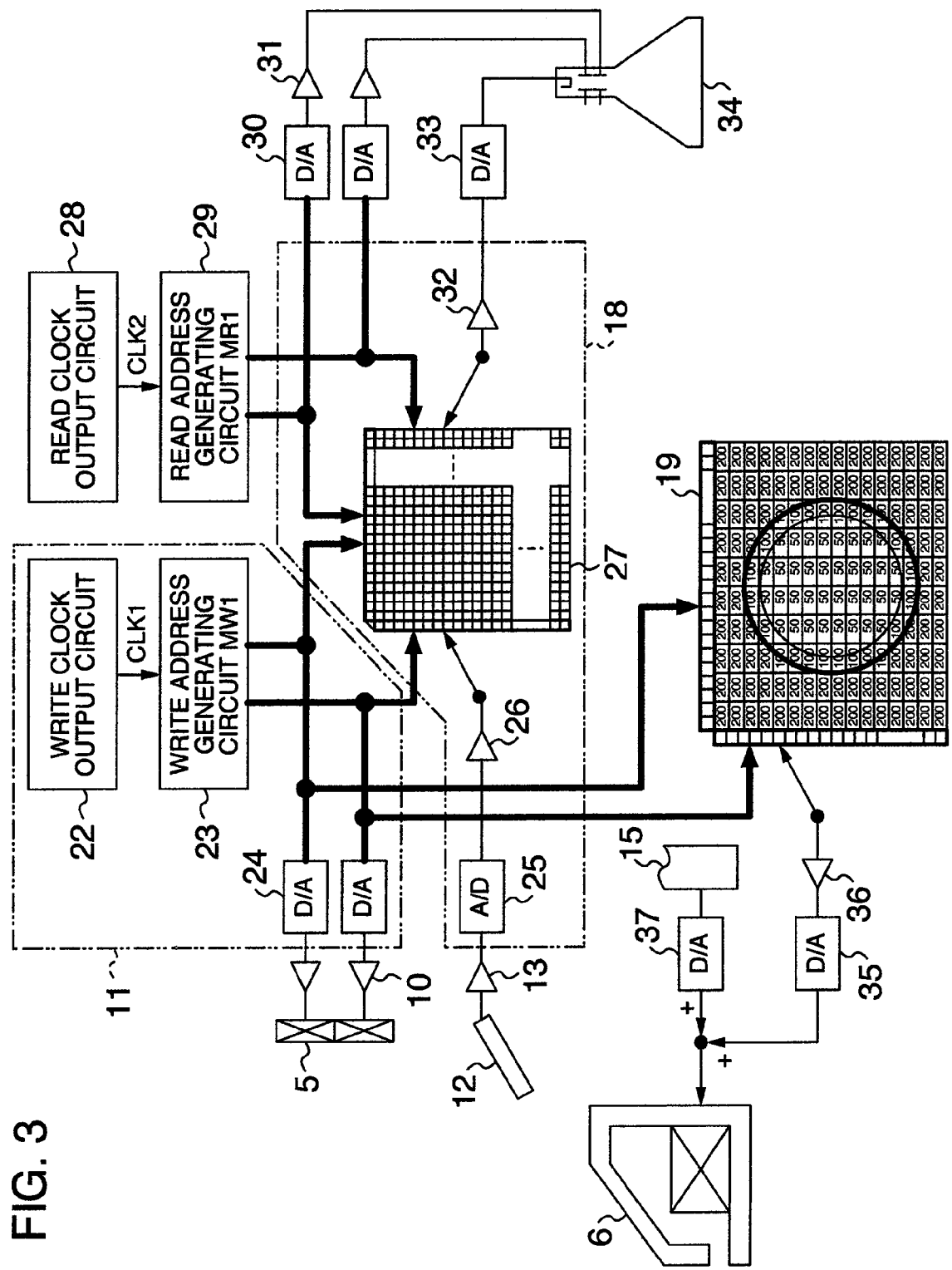
FIG. 3 is a schematic diagram for explaining a scanning signal generator.

Next, with reference to FIG. 3, the operation of the deflection signal generator 11 and the image forming unit 18 is explained in detail. First, in accordance with the clock output from a write clock output circuit 22, a write address generating circuit 23 of the deflection signal generator 11 outputs an address indicating the position at which the electron beam is radiated on the sample 7. Based on this address, an analog signal corresponding to the desired amount of the primary electron beam 2 to be deflected is generated from a D/A converter 24 in each of horizontal and vertical directions. In accordance with this analog signal, the deflector driver 10 drives the deflector 5.

In the process, the address output from the write address generating circuit 23 is output to the focus distribution memory 19 separately. From the focus distribution memory 19, the focal height (depth of the sample surface roughness) value corresponding to the address position is output to a D/A converter 35 through an output switch 35 operatively interlocked with the address. The focal height signal converted into an analog signal by the D/A converter 35 is combined with the representative focal height signal in the neighborhood of the sample surface output as an analog signal from the controller 15 through the D/A converter 35, and applied to the objective lens 6. The provision of this mechanism makes it possible to change the height of the focal point 41 of the primary electron beam 2 along the roughness of the sample surface in accordance with the position on the flat surface of the sample being scanned.

The image forming unit 18 operates in the manner described below. Specifically, the secondary electron signal detected by the secondary electron detector 12 is amplified by the amplifier 13 and converted into a digital signal by the A/D converter 25. This digital signal is stored in a memory group in the image memory 27 shown as an input switch 26. The memory group thus selected has one-to-one relation with the lines shown by the addresses generated in the write address generating circuit 23.

Figure 5:
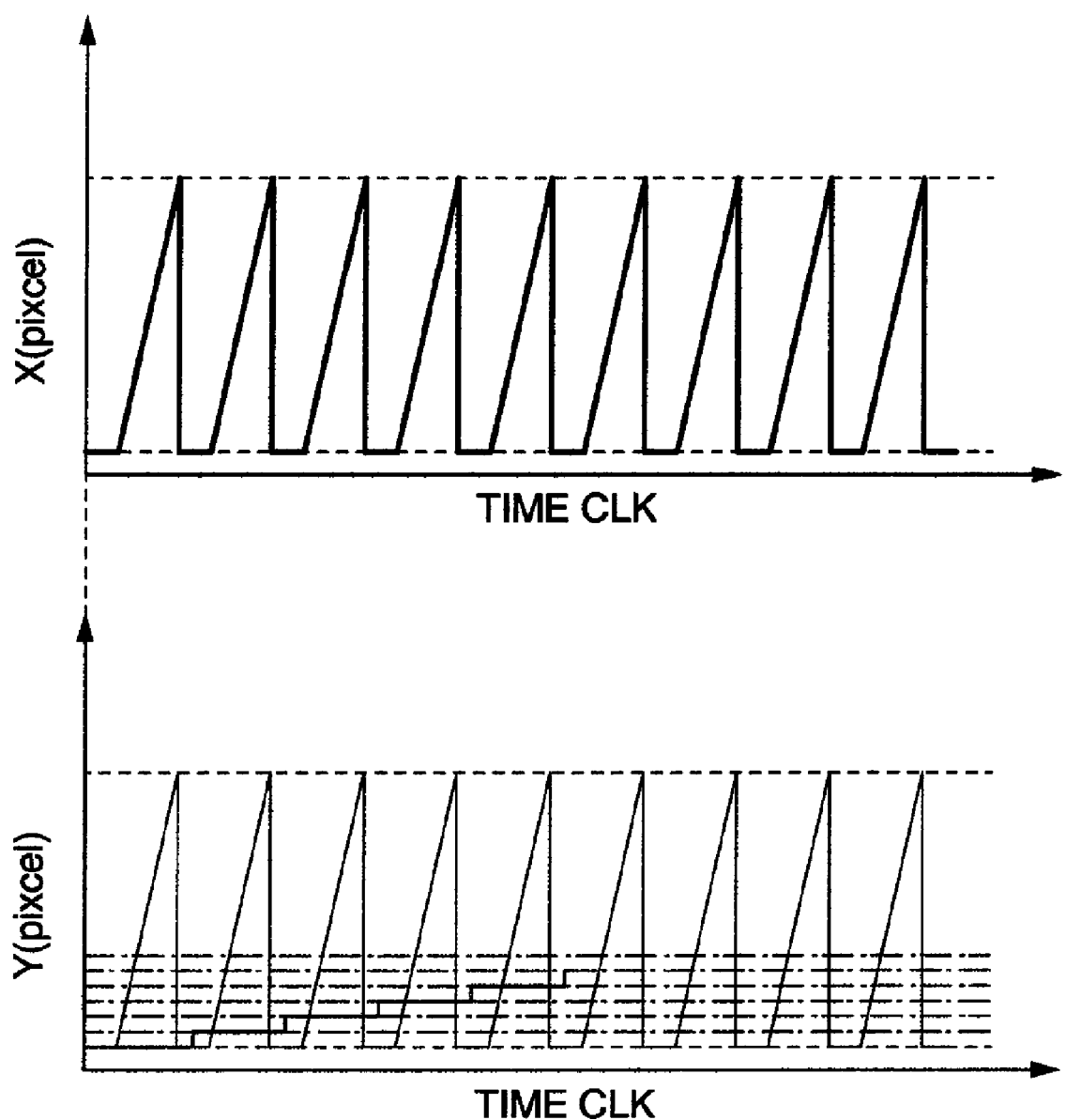
FIG. 5 is a diagram for explaining an example of the deflection pattern of the scanning signal.

The deflection position of the primary electron beam generated by the write address generating circuit 23 is controlled in accordance with the deflection pattern A shown in FIG. 5. Thus, the image data for each line sent to the image memory is arranged from the top downward sequentially in vertical direction (perpendicular to the lines) in the observation area on the sample. The input switch 26 stores these image data sequentially into a sequential vertical arrangement downward in the image memory. After completely picking up the images corresponding to a predetermined area on the sample 7 by repeating the process described above, the image data accumulated in the image memory 27 are displayed following the steps shown below. Specifically, in accordance with the clock output from a read clock output circuit 28, the address indicating the plotting position on the display 34 is output from a read address generating circuit 29. Based on this address, the analog signal corresponding to the desired amount of deflection of the plotting electron beam generated in the display unit 34 is generated from the D/A converter 30 in each of the horizontal and vertical directions. In accordance with this analog signal, the deflector in the display unit 34 is driven by the deflection amplifier 31.

In the process, the image forming unit 18 operates in the manner described below. Specifically, with the image data already accumulated in the image memory 27, a line of image data is read out as a digital signal from the memory group existing in the image memory shown in the form of the output switch 32. The memory group thus selected has one-to-one relation with the lines designated by the addresses generated by the read address generating circuit 29. The digital signal thus read out is converted into an analog signal by a D/A converter 33 and supplied to the display unit 34. In the display unit 34, the brightness of the plotting electron beam generated from the cathode is changed in accordance with the analog signal, while at the same time displaying the image by deflecting the plotting electron beam with the deflector in the display unit 34 described above.

The plotting position on the display unit 34 generated by the read address generating circuit 29 is controlled in accordance with the deflection pattern A shown also in FIG. 5. Therefore, the line-by-line image data output from the image memory are arranged sequentially from the top downward in vertical direction (perpendicular to the lines) in the observation area on the sample. The output switch 32 sends these image data sequentially to the display unit 34 also in accordance with the deflection pattern. Through this process, the image of the sample under the scanning electron microscope is displayed. Also, apart from FIG. 3, the image data accumulated in the image memory 27 is sent to the controller 15 and subjected to a predetermined image processing thereby to achieve a predetermined object.

Figure 4:
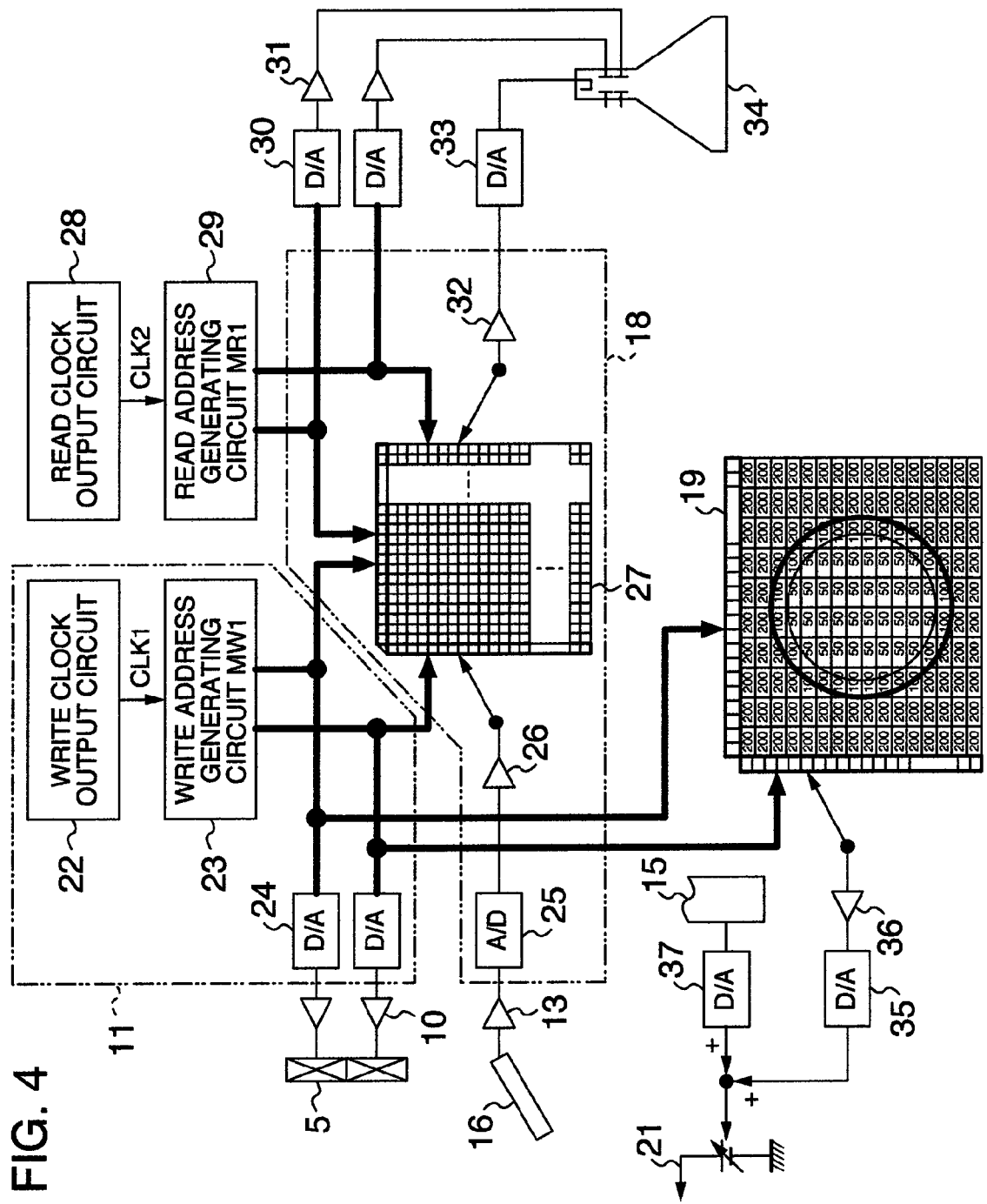
FIG. 4 is a schematic diagram for explaining a scanning signal generator.

In FIG. 4, the focal point is changed by changing the sample potential unlike in FIG. 3 where the focal point is changed by controlling the objective lens. Specifically, the combined signal of the focal height (the sample surface roughness depth) signal from the focus distribution memory 19 and the representative focal height signal in the neighborhood of the sample surface from the controller 15 can produce the effects similar to those of FIG. 3 by controlling the sample potential power supply 21 instead of the objective lens 6.

Figure 6:
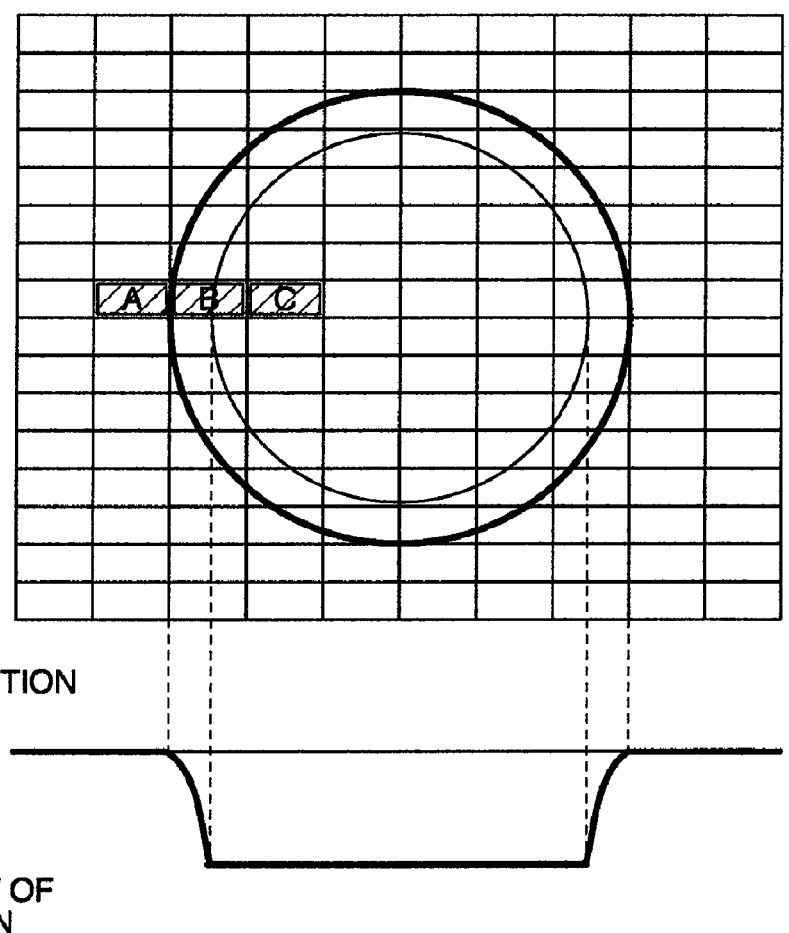
FIG. 6 is a diagram for explaining an example of measuring the sample surface roughness information for each pixel and storing the information in a focal point distribution memory.

Next, the method of measuring the surface roughness of the sample 7 for each pixel and storing the result in the focus distribution memory is explained with reference to FIG. 6. FIG. 6(a) shows a focus distribution matrix dividing the field of view of the SEM image in grid. Each cell contained in the matrix may represent either one pixel or a plurality of pixels collected. Cells A, B, C are located in the neighborhood of the edge of the holes plotted in plan on the matrix. Specifically, the cell A is located on the upper surface outside the hole, the cell B on the hole side wall, and the cell C on the hole bottom, as understood from the sectional view of the actual pattern shown in FIG. 6(b).

Figure 7:
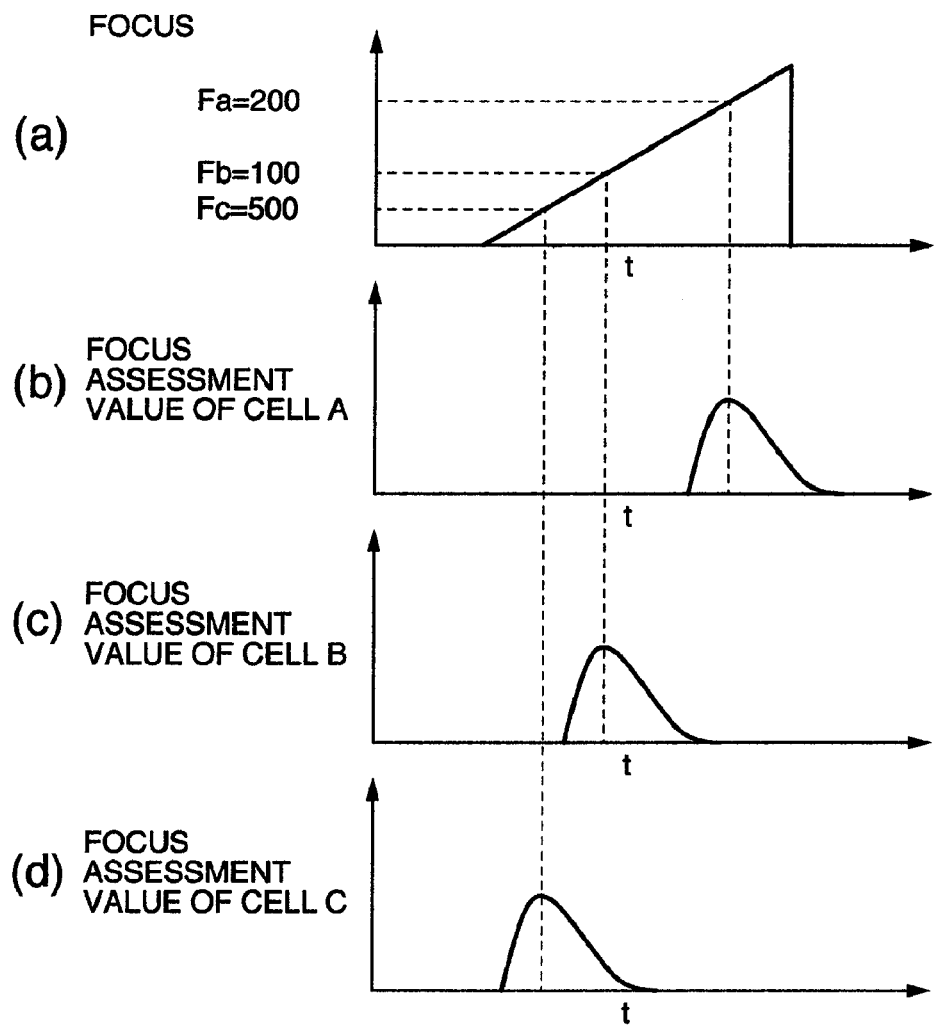
FIG. 7 is a diagram showing the change in focus assessment value with each point of the roughness of the sample surface set in focus.

The focal point is changed with time t as shown in FIG. 7(a). The focus assessment value, i.e. the image clarity of each cell reaches the peak in the case where each focal depth coincides with the focal height of the primary electron beam. In FIG. 7, the focus assessment value reaches the peak first for the cell C located on the hole bottom lowest in focal height. After that, the focus assessment value reaches the peak for the cell B located on the hole side wall, and finally, the focus assessment value reaches the peak for the cell A located on the upper surface of the sample. The time t at which the focus assessment value reaches the peak for each cell is followed upward along each one-dot chain in FIG. 7, and the focus value at the intersection with the focus line in FIG. 6(a) is stored as a sample surface roughness depth of each cell. This focus assessment value is calculated for all the cells thereby to complete the focus distribution matrix.

Figure 8:
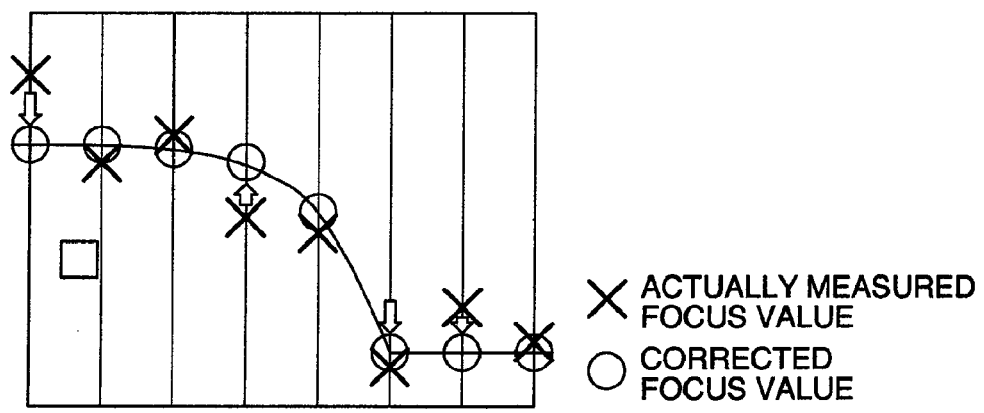
FIG. 8 is a diagram for explaining an example of adjusting the focus control amount by fitting the actual focus value measurement between the cells.

The actual measurement value of the sample surface roughness depth determined for each cell contained in the focus distribution matrix, however, contains variation components. In view of this, a corrected focus value having few variations is determined by fitting the actually measured focus values of the adjoining cells as shown in FIG. 8. By storing the result in the focus distribution memory, a more stable focal point control operation can be realized.

Figure 9:
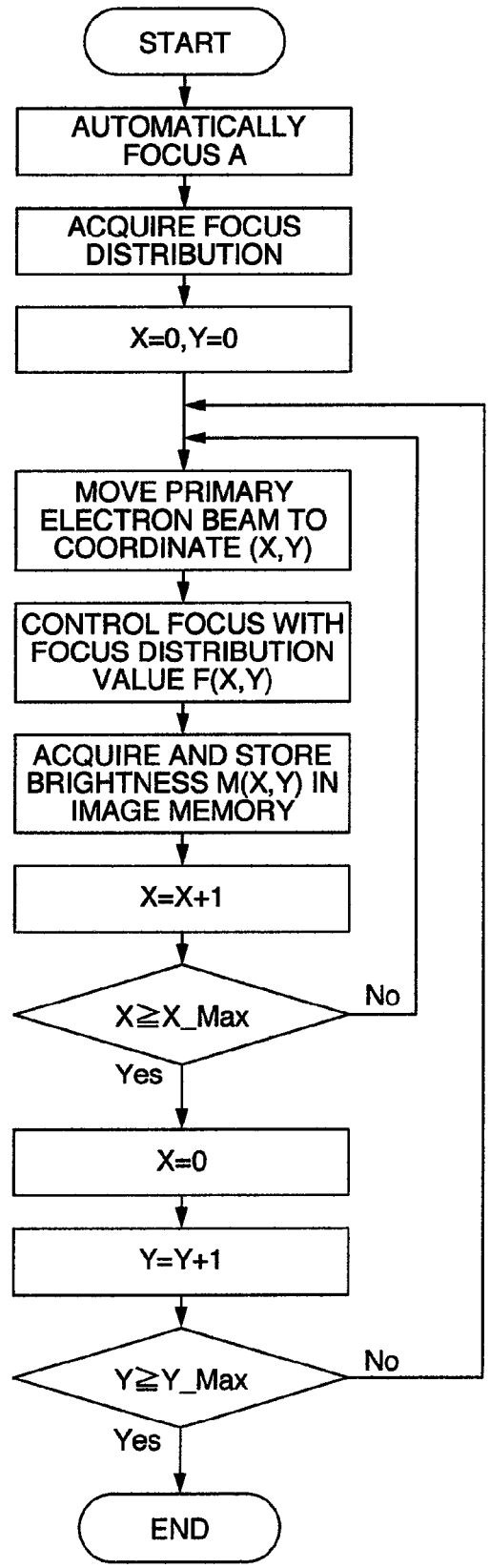
FIG. 9 is a flowchart for explaining the steps of retrieving an image.

FIG. 9 shows a series of steps for image retrieval. In starting the steps of the process, the automatic determination of the focal point A is executed with a feature mechanism of this invention to obtain the focal height for each pixel as a focus distribution. Next, starting from the scanning position (X=0, Y=0), the primary electron beam is first moved at each scanning position, and the focal point is controlled with the focus distribution value F(X,Y). Thus, the brightness M(X,Y) for the particular pixel is acquired and stored in the image memory. This operation is repeated until X_MAX and Y_MAX are reached in X and Y directions, respectively.

Figure 10:
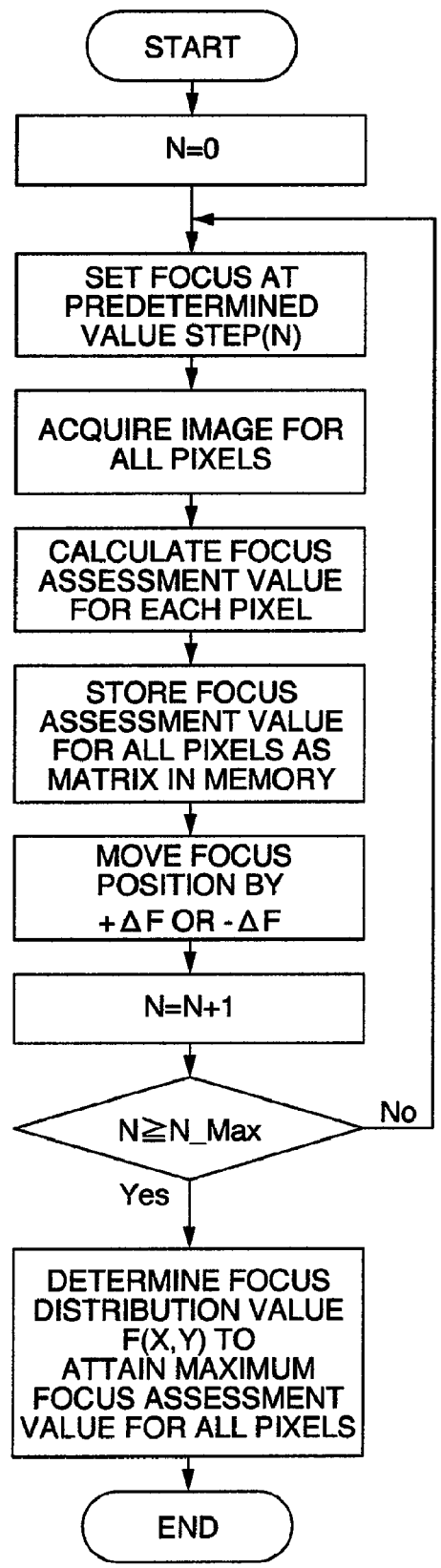
FIG. 10 is a flowchart for explaining the steps of focus adjustment.
Figure 11:
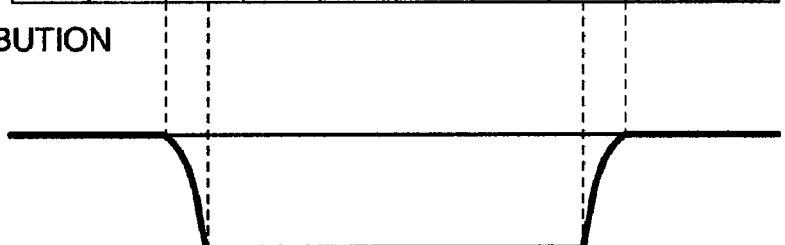
FIG. 11 is a diagram for explaining an example of the focus distribution matrix.

Next, the steps of the automatic determination of the focal point A using the feature mechanism of the invention are explained with reference to FIG. 10. First, starting with the step number 0, the focus is set at a predetermined value Step(N). Under this condition, the focus assessment value is calculated for all the pixels contained in the image, and stored in a predetermined area in the focus distribution memory. This process is repeated until the number of steps reaches N_MAX. Finally, the focus distribution value F(X,Y) is determined from the focus position associated with the maximum focus assessment value for all the pixels. These series of operation can produce the focus distribution as shown in FIG. 11.

Figure 13:
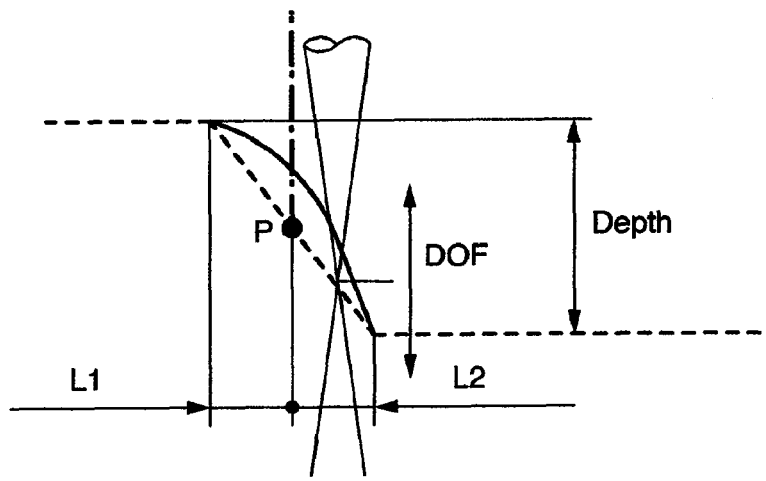
FIG. 13 is a diagram for explaining an example of focus adjustment along the side wall of a hole.

FIG. 12 shows an example in which the size of the circle plotted with thick solid line and the sample depth value "Depth" are manually input by the operator on the SEM image. According to this method, as shown in FIG. 13, the focus can be controlled exactly along the actual surface roughness of the sample with the hole side wall not as a vertical section but as a slope having a predetermined ratio between L1 and L2.

Figure 14:
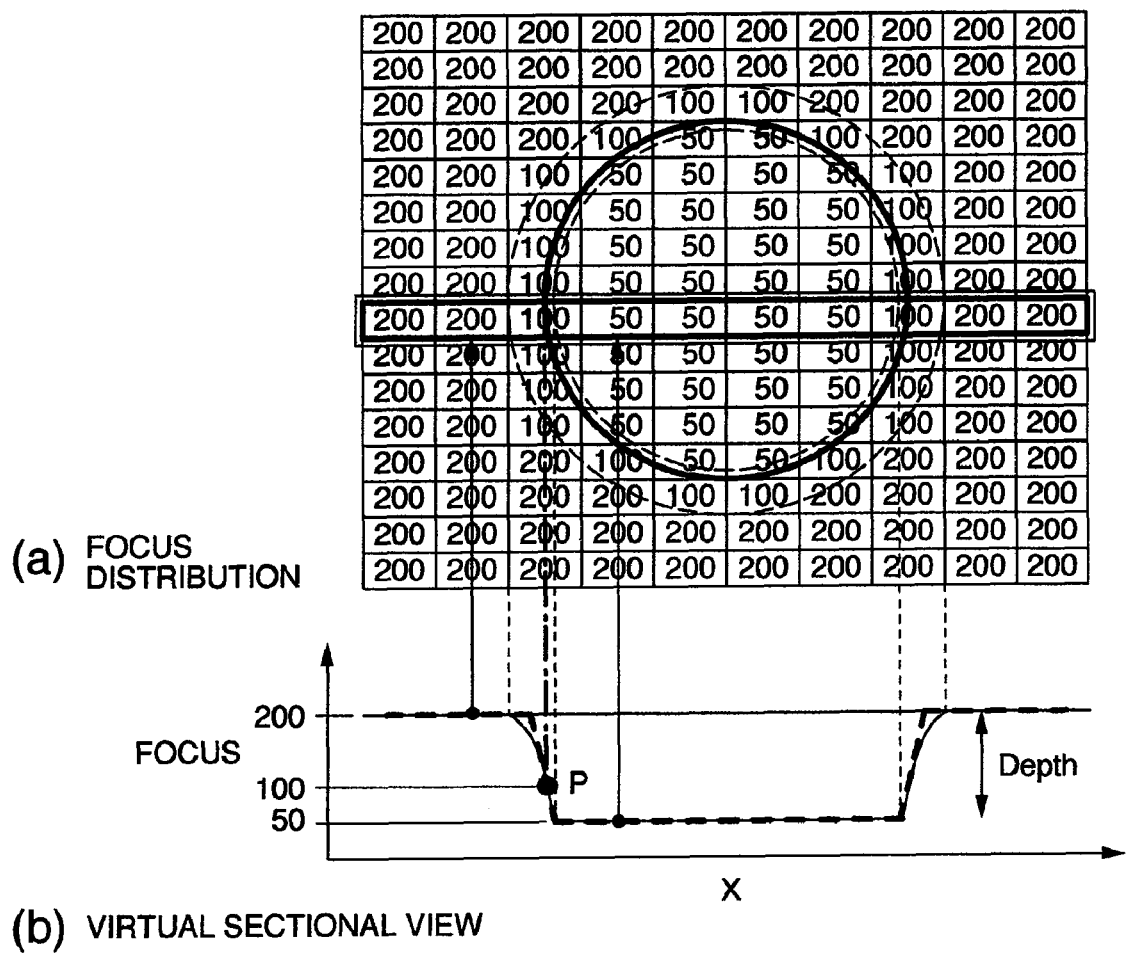
FIG. 14 is a diagram for explaining an example of determining the focus distribution from the information on the shape and depth of a circle.

FIG. 14 shows a method of determining the actual focus distribution by the manual input as described above, in which a virtual sample section is determined from the circle and depth manually input, and then the focus distribution is determined.

Figure 15:
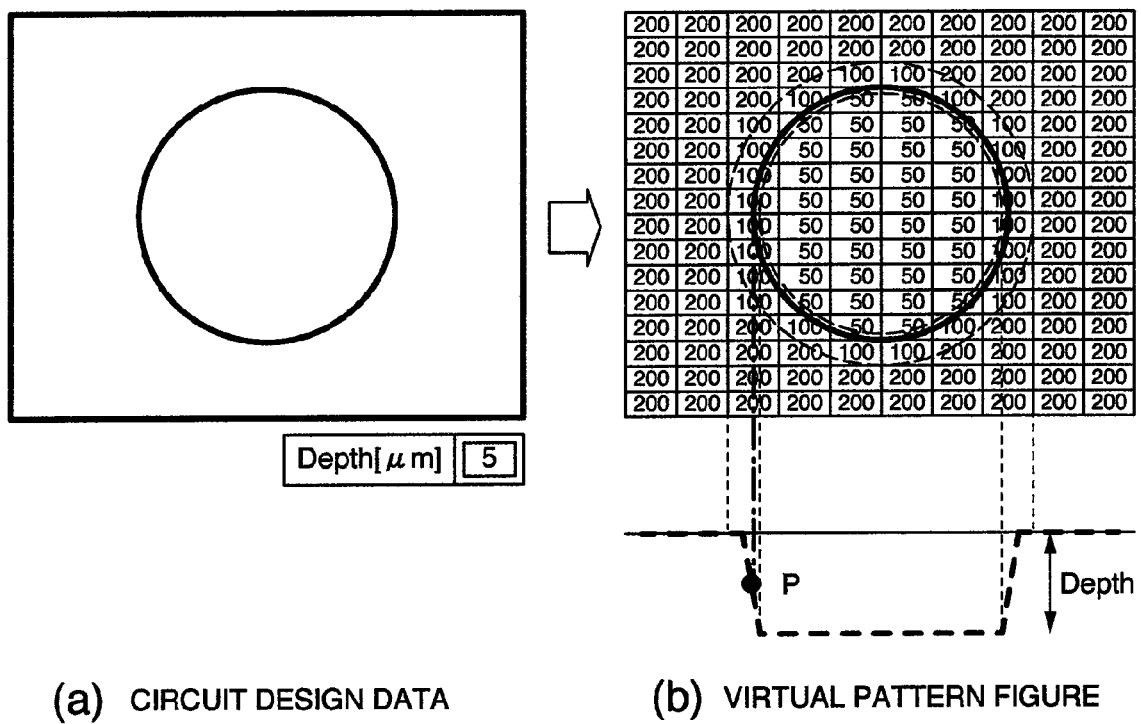
FIG. 15 is a diagram for explaining an example of determining the focus distribution based on the design data.

FIG. 15 shows a method of determining the focus distribution after first determining a virtual pattern from the circuit design data as a sample.

Figure 16:
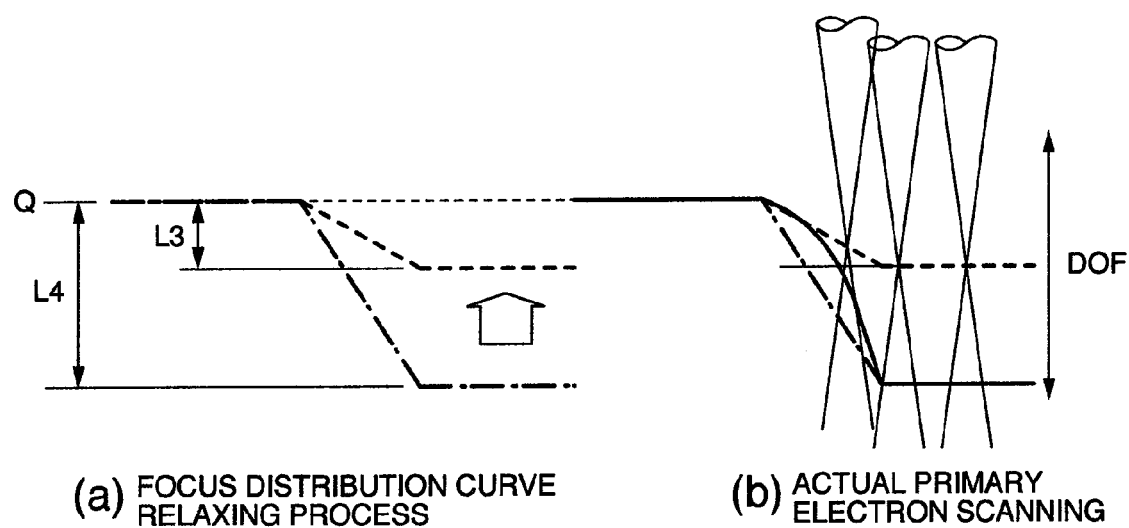
FIG. 16 is a diagram for explaining the process of relaxing the focus distribution curve.

In the methods described above, values having substantially no difference with the actual sample surface roughness are input as focal height values in the focus distribution memory. In the SEM image obtained by this focus control operation, however, the depth perception thus far generated by the minuscule image blur in the focal depth due to the sample roughness is lost. To overcome this problem, a method of securing a sufficient focal depth while maintaining the pseudo depth perception is shown in FIG. 16. In this method, the focus distribution curve obtained from the sample surface roughness is compressed at a predetermined ratio between L3 and L4 with the upper surface Q of the sample as an origin, and a state is intentionally created in which the focal point becomes distant from the sample surface within the range of the focal depth from the focal point of the primary electron beam 2 at the time of actually scanning on the hole bottom. In this way, the pseudo depth perception can be created.

Second Embodiment

The focus adjustment corresponding to a shape such as a hole pattern has been explained above. In some semiconductor devices, however, a material (such as an insulating material) charged by the electron beam scan and a material not so charged may coexist. In the case where the electron beam is scanned with a plurality of materials different in conductivity contained in the FOV, the phenomenon may occur in which some places are charged by the electron beam scan while other places are not.

In the case where the sample is charged, the focal point of the charged part may be changed, with the probable result that the image is blurred partially. The description that follows shows a case in which a focus distribution matrix including not only the rough shape of the sample but also the information on the sample composition is formed.

Figure 17:
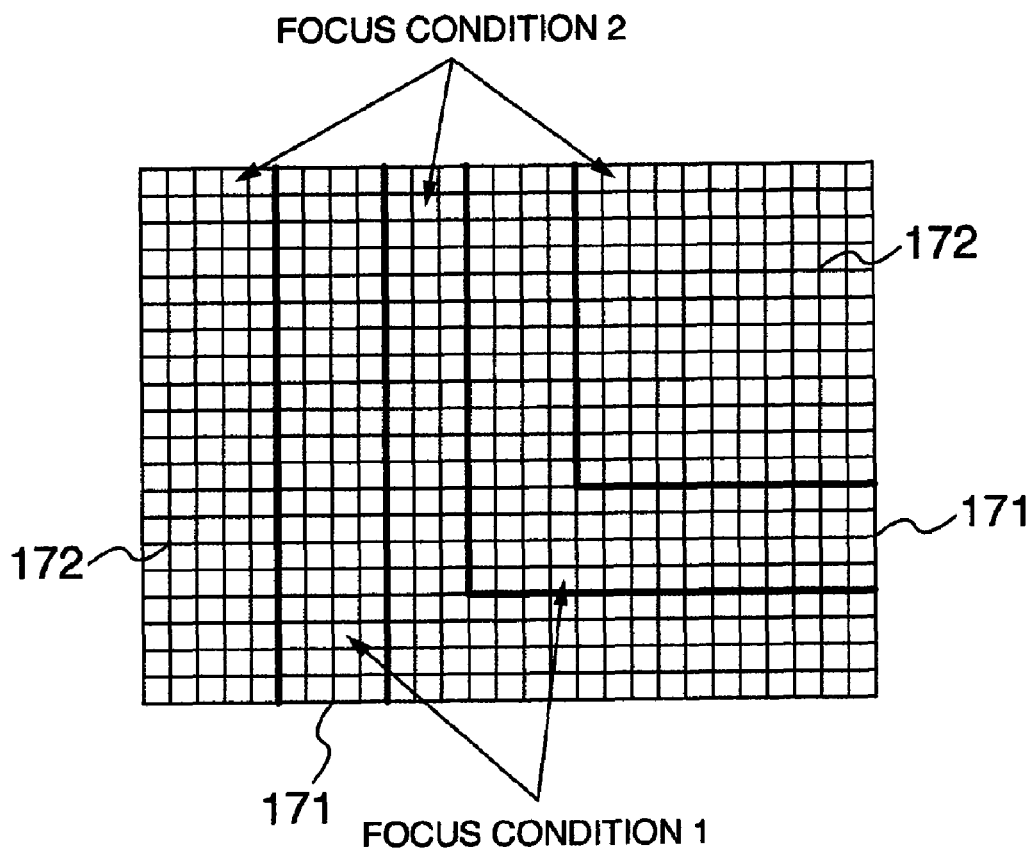
FIG. 17 is a diagram for explaining an example of the focus distribution matrix with FOV view) divided in grid based on the charge analysis.

FIG. 17 shows a focus distribution matrix with the FOV divided based on the charge distribution. Like in the focus distribution matrix relating to the sample surface roughness described above, each of the cells contained in the matrix may constitute either one or a plurality of pixels. In the case where an insulating layer is partially included as shown in FIG. 17, for example, the particular part is charged differently from the remaining parts, and therefore, the proper focus conditions thereof may also be different from those of the remaining parts. As shown in FIG. 17, therefore, the proper focus condition is stored for each material making up a pattern, and according to this condition, the excitation current of the objective lens, the negative voltage applied to the sample or both are controlled.

More specifically, assume that a pattern unit 171 shown in FIG. 17 is configured of Cr and the remaining part of the sample formed of MoSi. The remaining part X is more easily charged than the pattern unit 171. Specifically, the proper focus conditions are stored for the cells of the pattern unit 171 and those of the remaining part 172, so that the proper focus adjustment corresponding to the difference in charge amount can be made.

The charge accumulated in the sample is dependent also on the energy of the electron beam arriving at the sample. Desirably, therefore, the focus distribution matrix is prepared for each amount of the arriving energy, and in accordance with each setting of the arriving energy amount, the proper focus distribution matrix is used.

By collating this focus distribution matrix dependent on the charge with the sample design data, the focus at each position in the FOV can be properly adjusted. As an alternative, the physical shape information on the roughness of the pattern surface is obtained from the design data while at the same time detecting the charge distribution of each material making up the roughness, and based on these information, the proper focus condition may be determined. In other words, the proper focus condition may be determined based on the combined conditions including the shape information and the charge information.

Figure 18:
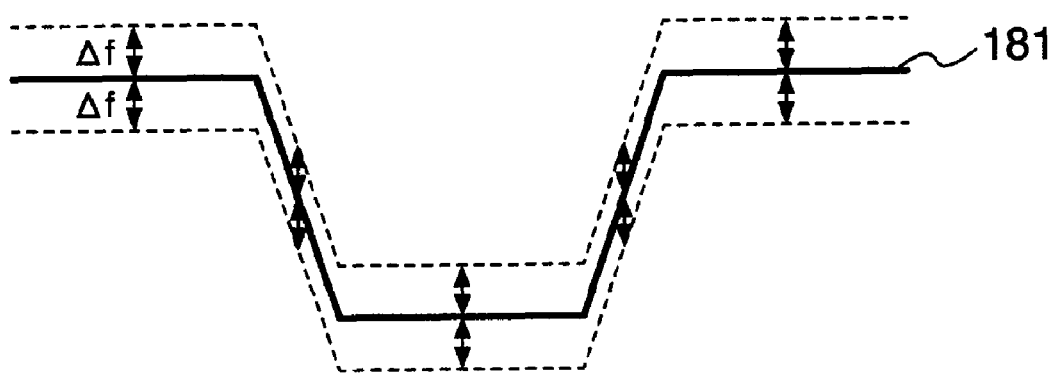
FIG. 18 is a diagram for explaining an example of determining the proper focus conditions based on the design data.

The pattern of the design data and the pattern actually formed through the semiconductor fabrication process, however, may fail to coincide with each other. The focus condition setting based on the design data, therefore, may be regarded as a coarse adjustment, and after the coarse adjustment, as shown in FIG. 18, for example, the focus condition of each matrix is detected based on the clarity of the image obtained at the time of focus adjustment made, by an amount equivalent to a predetermined focus change width, on the pattern roughness information obtained from the design data. Based on the condition thus detected, the fine focus adjustment may be made.

With this configuration, the proper focus condition for each cell can be detected by changing the focus condition by $2\Delta f$ for each cell, where $2\Delta f$ is not necessarily constant for the FOV as a whole. The measurement efficiency or the throughput is given priority and $\Delta f$ is set to a small value, for example, for the part considered smaller in the width of roughness change. As for the part such as the hole pattern side wall where the height change is considered large, on the other hand, $\Delta f$ is set to a large value. In this way, an error-free detection is made possible. The hole pattern shape 181 is formed of a line indicating the contour of the pattern section determined from the design data.

Third Embodiment

Figure 19:
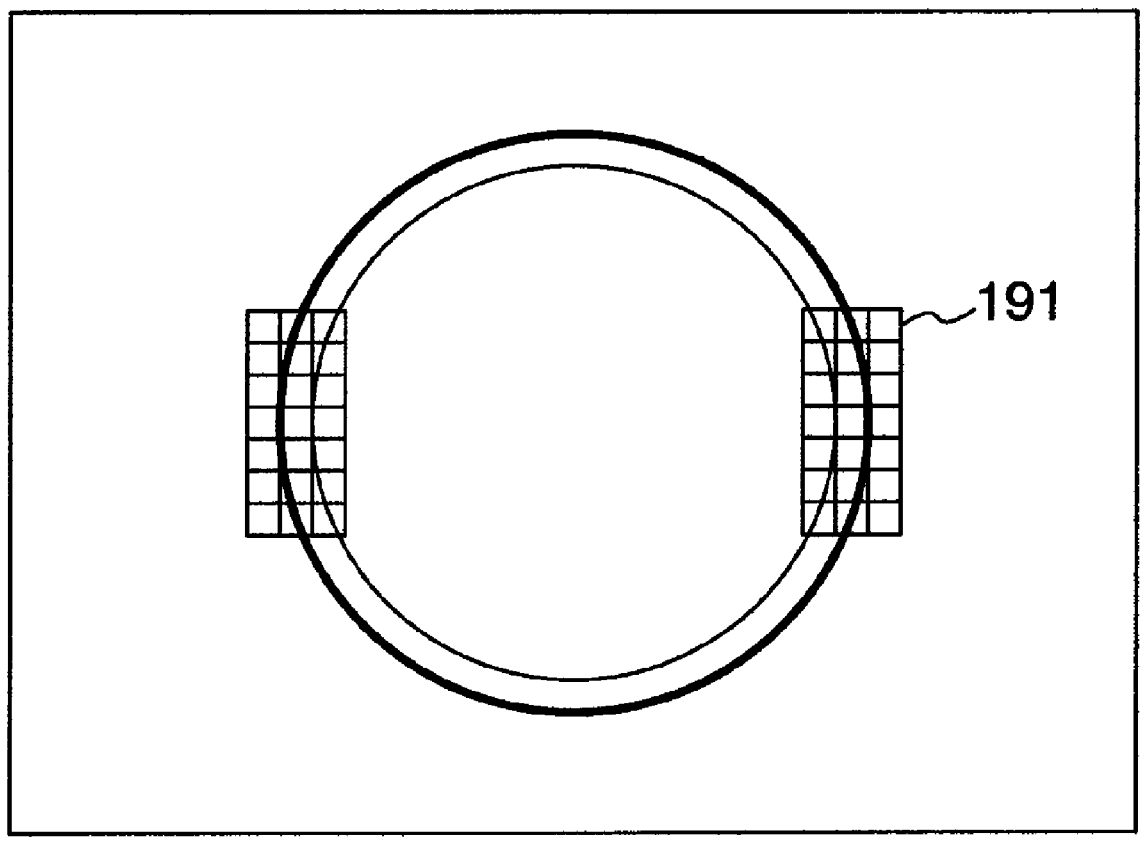
FIG. 19 is a diagram for explaining an example of forming a focus distribution matrix at partial points in the image.

Now, an example is explained below in which the focus distribution matrix is formed selectively only for the required part but not the whole of FOV. The CD-SEM (critical dimension-scanning electron microscope), for example, is a device for measuring the pattern width based on the line profile obtained by detecting such electrons as the secondary electrons or the back scattered electrons obtained at the time of scanning the electron beam on the sample. In the CD-SEM, the distance between edges is measured by detecting the peaks of the line profile and measuring the length between the peaks. For this device, the information on the area where the peaks are detected is very important. By forming the focus distribution matrix selectively in a box cursor 191 used for the hole pattern image as shown in FIG. 19, therefore, the required focus condition can be detected with a high efficiency.

The box cursor is for designating the edge portion used for measurement, and by forming the focus distribution matrix selectively in the area designated by this cursor, the focus condition for the required area can be easily detected.

Fourth Embodiment

In recent years, the pattern-forming process using the exposure technique with the optical exposure device (stepper) called the double patterning has come to find application. According to this technique, the line patterns with a shorter interval can be formed by exposing the pattern in two sessions. The line pattern formed by this technique has so close an interval between lines that the line pattern and the space between the line patterns may have an equal size to each other.

In the CD-SEM, the width of each line and space and the pitch of the lines are measured based on the electron micrograph having the aforementioned line and space patterns. In the case where the brightness is not substantially different between the line pattern and the space pattern, however, it may happen that the space width is actually measured in the case where the line width should be measured, or vice versa.

This phenomenon may occur in the case where only lines and spaces are displayed in the FOV with a multiplicity of line patterns arranged by the double patterning technique. In the presence of lines or spaces in the FOV with substantially no contrast between them, the resulting image is only an arrangement of a plurality of line edges, and therefore, the lines and the spaces may confused for each other. In view of this problem, the present embodiment provides a technique whereby the pattern such as the line-and-space pattern difficult to distinguish the lines (convex part) and the spaces (concave part) from each other based on the electron micrograph alone is scanned with an electron beam based on the focus distribution matrix acquired in advance, and based on the focus assessment value in the FOV, the lines and the spaces are distinguished from each other.

Figure 20A:
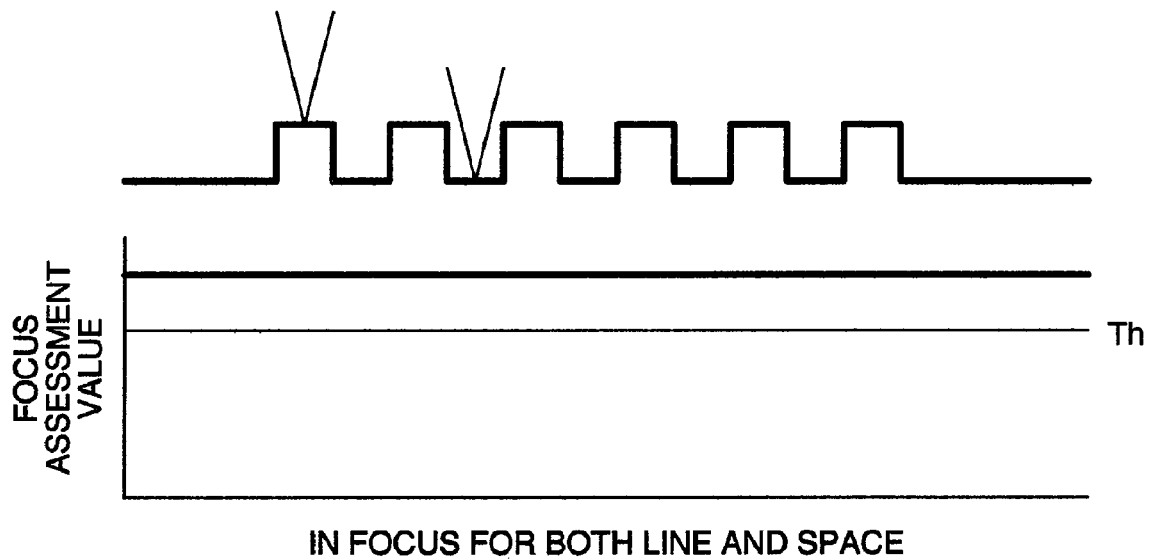
FIGS. 20A and 20B are diagrams for explaining the roughness determination of the line and the space pattern.
Figure 20B:
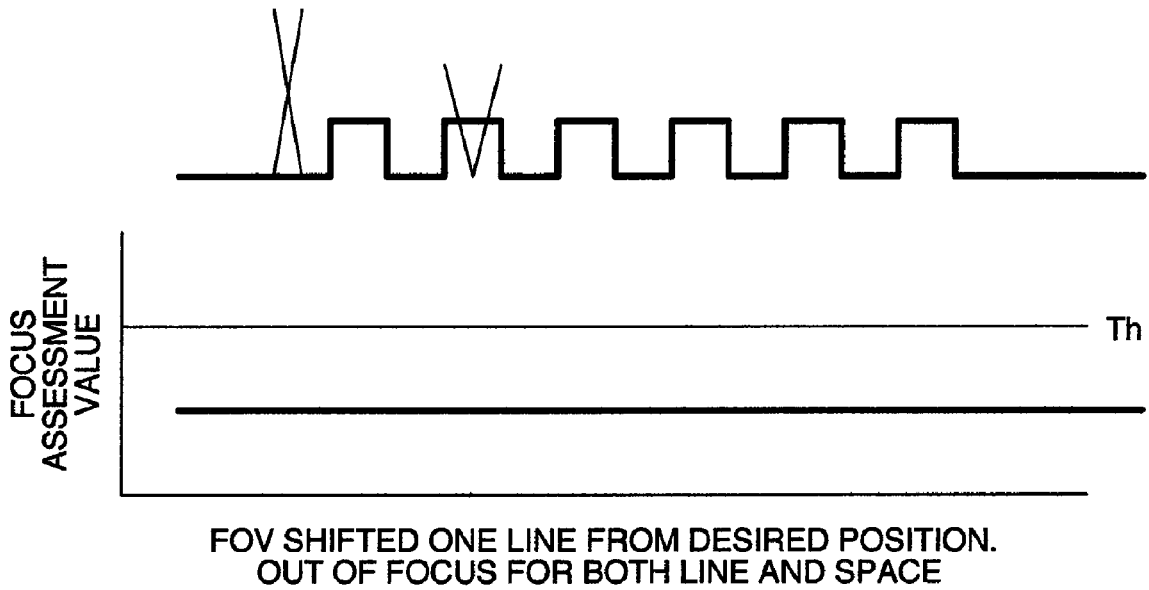

As shown in FIGS. 20A and 20B, the focus assessment value assumes a high value as long as the line patter and the space are in focus with each other. In the case where the electron beam is scanned on the lines and the spaces under the opposite focus conditions, i.e. in the case where the convex part is focused under the focus conditions for the concave part, and vice versa, however, the focus assessment value for the image as a whole is very low. The focus adjustment confusing the convex and concave parts for each other as described above would lead to a very low focus assessment value as compared with the reverse case, and therefore, both can be identified very clearly.

In the case where a predetermined threshold is set for the focus assessment value and a focus assessment value higher than the threshold is obtained, for example, it indicates that a line pattern and a space are arranged at a predetermined position in the FOV. Based on this information, the point of measurement is set at a proper position. In the case where the predetermined focus assessment value is not reached, on the other hand, the position in FOV is corrected or the measurement point adjusted to set the measurement point at the proper position. According to this embodiment, therefore, the desired part can be measured without confusing the lines and spaces for each other.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus for adjusting the focus of the charged particle beam based on predetermined focus adjust conditions,
   wherein the focus adjust conditions for each point in the scanning area are determined in advance for scanning the charged particle beam on a sample formed in the semiconductor fabrication process, and the charged particle beam is scanned by selectively applying the focus adjust conditions thus determined to the patterns formed under the same fabrication conditions as the sample for which the focus adjust conditions have been determined.

2. The charged particle beam apparatus according to claim 1, further comprising a storage medium for storing the control amount of the focus adjustment and the coordinate indicating the scanning position of the sample by relating to each other.

3. The charged particle beam apparatus according to claim 2,
   wherein selected one of the image clarity obtained with the focal point changed stepwise and the focus control amount having the highest focus assessment value is stored in units of pixel in the storage medium.

4. The charged particle beam apparatus according to claim 2,
   wherein the control amount of focus adjustment is determined based on the design data of the sample.

5. The charged particle beam apparatus according to claim 2,
   wherein the control amount of focus adjustment is determined based on the input sample roughness information.

6. The charged particle beam apparatus according to claim 3,
   wherein the control amount of focus adjustment at each point is corrected by being fitted with each other.

7. The charged particle beam apparatus according to claim 3,
   wherein the height difference of the control amount distribution curve for focus adjustment is reduced.

8. The charged particle beam apparatus according to claim 1,
   wherein the focal point is changed by adjusting the voltage applied to the sample.

9. The charged particle beam apparatus according to claim 1,
   wherein the focal point is changed by adjusting the excitation current supplied to the objective lens for focusing the charged electron beam.

* * * * *